(12) United States Patent
Ikeda et al.

(10) Patent No.: US 6,462,630 B1
(45) Date of Patent: Oct. 8, 2002

(54) WIDEBAND NOISE REDUCING DEVICE

(75) Inventors: Eiichi Ikeda, Kanagawa; Masanobu Nakamura, Tokyo; Yoshikuni Kobayashi, Yokohama; Masahiro Mukaida, Gunma, all of (JP)

(73) Assignee: Oki Electric Cable Co., Ltd., Kawasaki (JP)

( * ) Notice: Subject to any disclaimer, the term of this patent is extended or adjusted under 35 U.S.C. 154(b) by 6 days.

(21) Appl. No.: 09/610,227

(22) Filed: Jul. 3, 2000

(51) Int. Cl.[7] .................................................. H03H 7/00
(52) U.S. Cl. ......................................... 333/181; 333/12
(58) Field of Search ................................ 333/181, 182, 333/184, 185, 12; 439/620

(56) References Cited

U.S. PATENT DOCUMENTS 6,057,512 A * 5/2000 Noda et al. ................. 174/250

FOREIGN PATENT DOCUMENTS

| JP | 11-219819 | 8/1999 |
| JP | 11-312558 | 11/1999 |

* cited by examiner

Primary Examiner—Robert Pascal
Assistant Examiner—Joseph Chang
(74) Attorney, Agent, or Firm—Foley & Lardner

(57) ABSTRACT

A wideband noise reducing device has a three level structure including a magnetic member comprising at least one magnetic film, and first and second boards disposed on both sides of the magnetic member so that the magnetic member is sandwiched between the first and second boards. Each of the first and second boards has a signal pattern portion. The signal pattern portions of the first and second boards are connected with each other to form a signal line wound around the magnetic member.

19 Claims, 10 Drawing Sheets

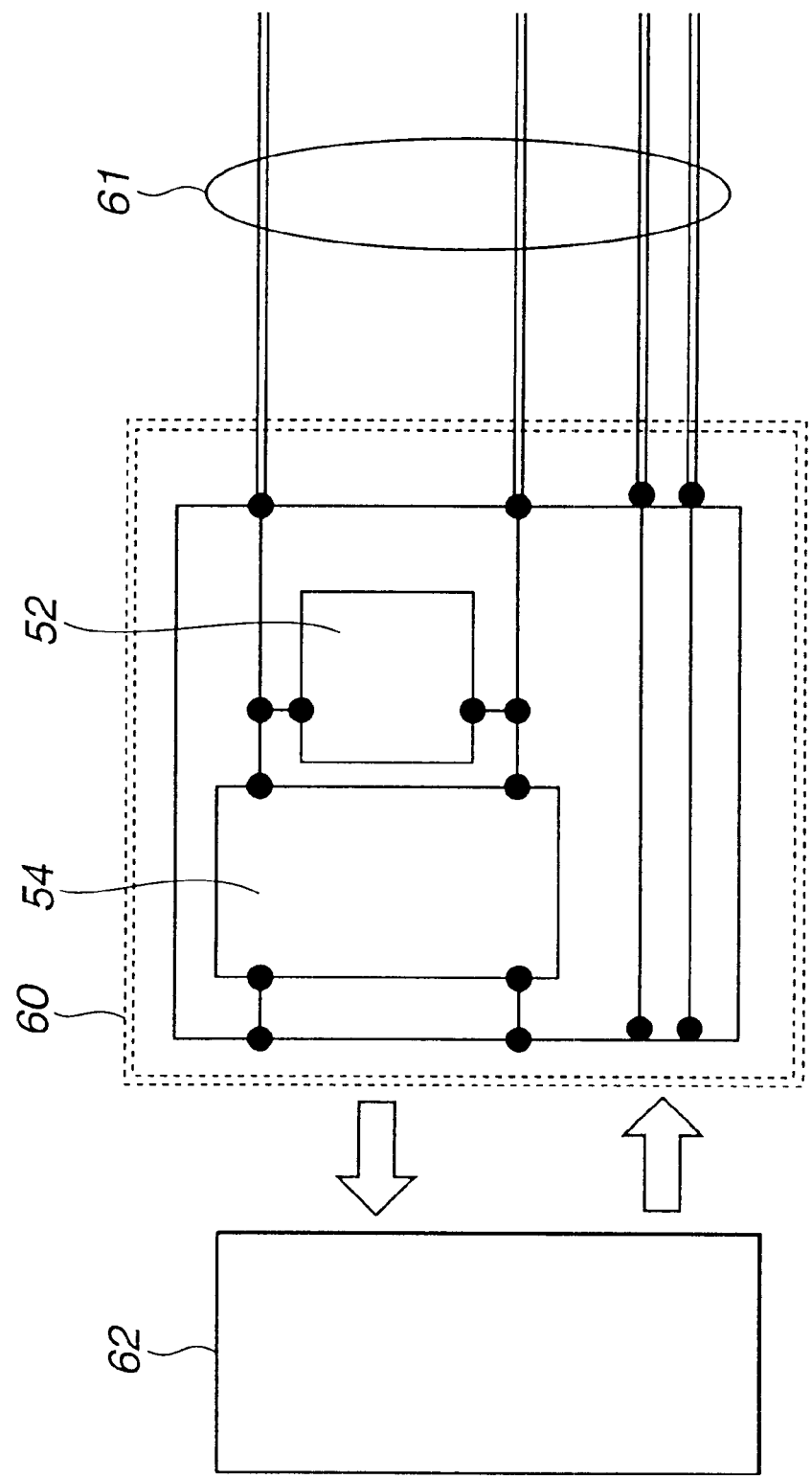

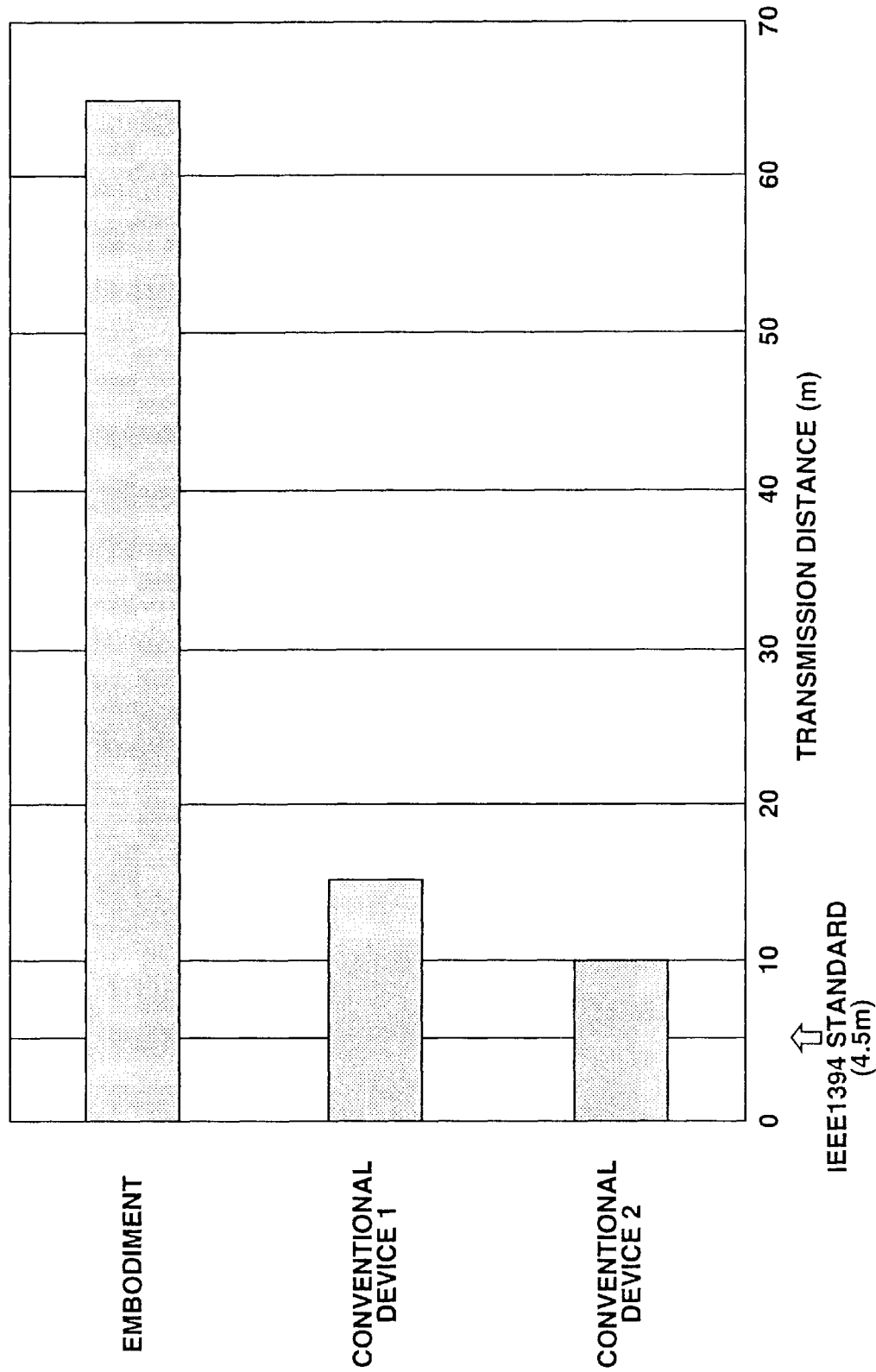

WIDEBAND NOISE REDUCING DEVICE

BACKGROUND OF THE INVENTION

The present invention relates to noise filters usable in various apparatus such as apparatus for communication, OA and games, to connectors usable for cables and terminal devices, and to multi-level structures used for such devices. More specifically, the present invention relates to wideband thin noise filters for removing high frequency noise, and wideband, expanded function connectors.

The increase in broadcast output, the increase of illegal radio devices and the wide spread use of high frequency devices are all factors deteriorating the electromagnetic environment today.

Among various measures against high frequency noises, a filter using a coil is popular. Moreover, the recent demand for smaller and more uncostly electronic devices is directed to the filter, too.

When a conventional magnetic material is employed, the attenuation decreases sharply in the high frequency region, due to resonance, as compare with a desired attenuation level, as shown by a one dot chain line 34 in FIG. 2.

When a lead wire is wound around the conventional thin film magnetic material, the magnetic material in the form of the thin film is liable to bend.

In the case of a manually wound lead wire, the winding condition is irregular. This irregularity increases the non-uniformity of the characteristic especially in the high frequency region.

Furthermore, as to the filter for a high frequency region, there still remains the following technical tasks unsolved. (i) No leakage inductance and low irregularity in inductance in pairs. (ii) Small Inter-winding capacitance. (iii) Small inter-channel crosstalk. (iv) High permeability and high resistance at high frequencies.

On the other hand, in PC (personal computer), and LAN, the transmission speed or data transfer rate is increased more or more, and the speed increase is also achieved in terminal devices. Relatively inexpensive electric wires and cables have problems in high speed transmission, and the trend is toward optical means.

However, the use of electric wires and cables, if appropriate for higher transmission, can reduce the total cost, and lower the power consumption by eliminating the need for O/E and E/O converters. Moreover, the merit of continuing the use of the existing transmission medium is significant.

A conventional IEEE1394 cable 51' as shown in FIG. is a high speed PC interface adapted for high speed transmission (400 Mbps Max) such as high speed picture transmission.

However, the conventional IEEE1394 interface 51' has the following technical problems. First, the transmission distance is limited (Standard: 4.5 m). This is said to be the influence of a power source line. However, even for a four core type having no power source line, the upper limit is 10 m (actually measured evaluation). Second, the handling is not easy because of its shield structure (A cable is thick and hard.). Third, the connector terminal treatment is complicated and costly because of the shield of the cable

SUMMARY OF THE INVENTION

It is an object of the present invention to provide a wideband noise then filter which is efficient in removing noise, small in signal attenuation, and small in size It is another object of the present invention to provide a connector capable of expanding the transmission band and transmission distance.

According to the present invention, a wideband noise reducing device comprises: a magnetic member comprising at least one magnetic film; and first and second boards such as flexible printed circuit boards (FPC). The magnetic member is sandwiched between the first and second boards. Each of the first and second boards comprises a signal pattern portion. The signal pattern portions of the first and second boards are connected with each other to form a signal line wound around the magnetic member.

BRIEF DESCRIPTION OF THE DRAWINGS

FIG. 5B is a schematic diagram showing the cable of FIG. 5A.

FIG. 6 is a graph showing the results of performance comparison test between the wideband connector according to the second embodiment and conventional devices.

DETAILED DESCRIPTION OF THE INVENTION

Figure 1A:
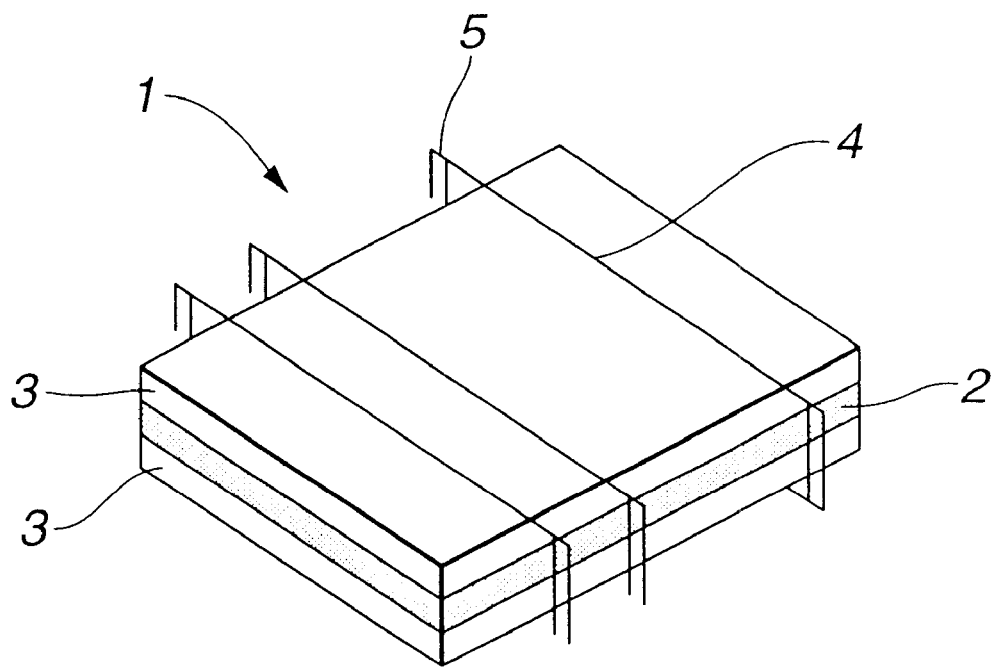
FIG. 1A is a schematic perspective view showing a wideband thin noise filter according to a first embodiment of the present invention.
Figure 1B:
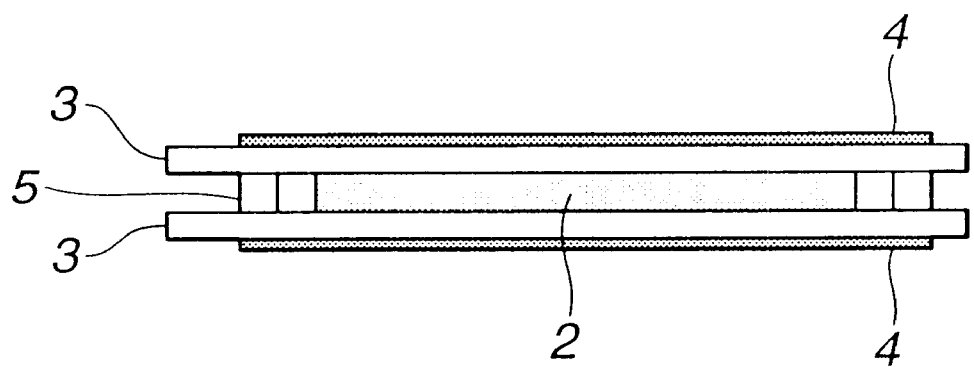
FIG. 1B is a sectional view of the wideband thin noise filter of FIG. 1A.
Figure 1C:
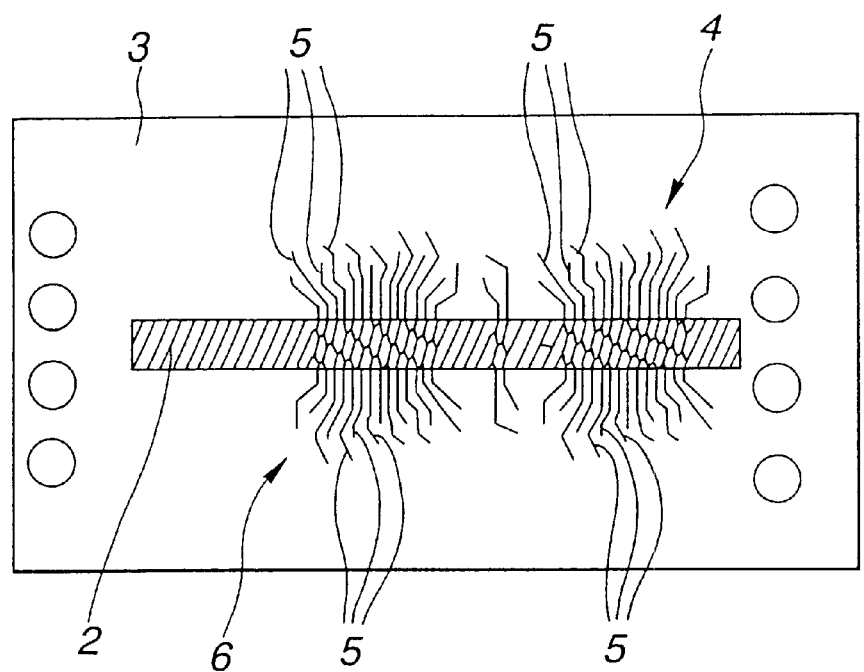
FIG. 1C is a plan view of the wideband noise filter of FIG. 1B.

FIGS. 1A, 1B and 1C show a wideband thin noise filter 1 according to a first embodiment of the present invention in schematic perspective, section and plan.

The wideband thin noise filter 1 includes a magnetic member 2 having at least one magnetic thin film, and first and second (or upper and lower) thin board 3 between which the magnetic member 2 is sandwiched. In this embodiment, the magnetic member 2 is a composite magnetic member including a plurality of magnetic films, and each of the thin board 3 is a thin plate in the form of FPC (flexible printed circuit board).

In this example, there is, as shown in FIG. 1C, formed a long rectangular hole elongated left and right as viewed in FIG. 1C. The magnetic member 2 is embedded in this hole. The first and second board 3 extend beyond the intermediate layer of the magnetic member 2 as shown in FIG. 1B. FIG. 1A merely shows the three-level structure of the wideband thin noise filter 1 in a schematic form.

Figure 1D:
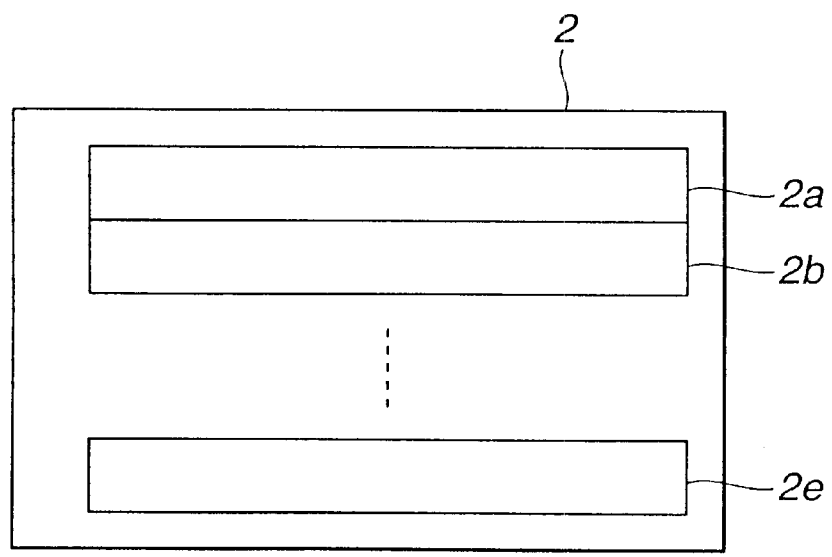
FIG. 1D is a sectional view showing a magnetic member in the wideband thin noise filter of FIGS. 1A, 1B and 1C.

FIG. 1D shows the composite magnetic member 2 which, in this example, includes at least a magnetic layer 2a of magnetic material for low frequency, a magnetic layer 2b of magnetic material for high frequency, and a magnetic layer 2e of magnetic material for medium frequency.

In the composite magnetic member 2, two adjacent magnetic films or layers are separated by an insulator film or layer. The insulating material may be an Si type. Moreover, an insulating film is interposed between the magnetic member 2 and each of the first and second boards 3.

In this practical example;
Magnetic film thickness=0.01 μm~500 μm
Insulator film thickness=0.01 μm~500 μm
Pattern width=10 μm~500 μm
Inter-pattern gap=10 μm~500 μm
Number of turns=10~50 (The number of turns is selected in accordance with the amount of attenuation and frequency band.)
(1) The Conditions for the Magnetic Film:
   (i) Material=amorphous magnetic material, In accordance with required characteristics, the frequency characteristic of the magnetic permeability is set by selecting the composition of material, and aging.
   (a) In consideration of material having high permeability, the composition of the amorphous magnetic material in this example is set as follows:
   Fe: 1~30%
   Ni: 30~82%
   Cu: 0~20%
   Mo: 0~10%
   (b) Aging condition:
   No heat treatment or heat treatment in a temperature range of 500~1500° C.
   (ii) Film thickness: The film thickness is set to a small value having little or no influence of the skin effect.
   (iii) Total thickness: The total thickness is so set as to increase the sectional size by multi-layer structure.
(2) Pattern
   (i) Pattern width: The pattern width is made as narrow as possible within a range covering the required current capacity.
   (ii) Inter-pattern pitch: The inter-pattern pitch is made as small as possible to secure the length of magnetic path.
(3) Number of Turns:
   L increases in the form of the square of the number of turns, so that the number of turns is set at a large value.
(4) Insulator:
   (i) Between pattern and magnetic film: The thickness is made as thick as possible in consideration of the high frequency characteristic.
   (ii) Gap between magnetic films: The gap is made as thin as possible.

Each of the thin boards 3 is in the form of a laminate of insulating film, adhesive, copper foil pattern, adhesive and insulating film which are superposed successively.

The first (or upper) thin board 3 has a first (or upper) signal pattern portion 4, and the second (or lower) thin board 3 has a second (or lower) signal pattern portion 4. The first and second signal pattern portions 4 are connected through a plurality of through holes 5 extending through the first and second boards 3. Accordingly, a twisted pair pattern is formed in each of the first and second signal pattern portions 4. It is optional to form a parallel pattern partly in the signal pattern portions 4.

In the case of minute pattern structure, it is optional to employ bump for connection between the first and second (FPC) thin boards 3.

In the composite magnetic member 2 of this embodiment, a permalloy sheet is used as high permeability amorphous material. The composite magnetic member 2 is formed by using a plurality of magnetic films having different frequency characteristics of the permeability by adjusting the heat treatment condition (inclusive of a condition of no heat treatment) and the film thickness.

In this example, the magnetic film for low frequency has a great permeability. The permeability is increased as much as possible. The magnetic film for medium frequency has such a characteristic that the permeability is as great as possible, but the permeability starts decreasing in a region between medium and high regions. The magnetic film for high frequency has such a characteristic that the permeability describes a descending curve, and the descending curve becomes gradual from a location where the self-inductance of a lead wire starts decreasing. The magnetic films of these three different kinds are used in combination in conformity with the target frequency range and attenuation.

Moreover, for the characteristics for low frequency, medium frequency and high frequency, it is possible to use a combination of a single-layer or multi-layer structure formed by using a magnetic film of one kind by adjusting the heat treatment condition and material composition, and the self-inductance of the signal pattern.

Figure 2:
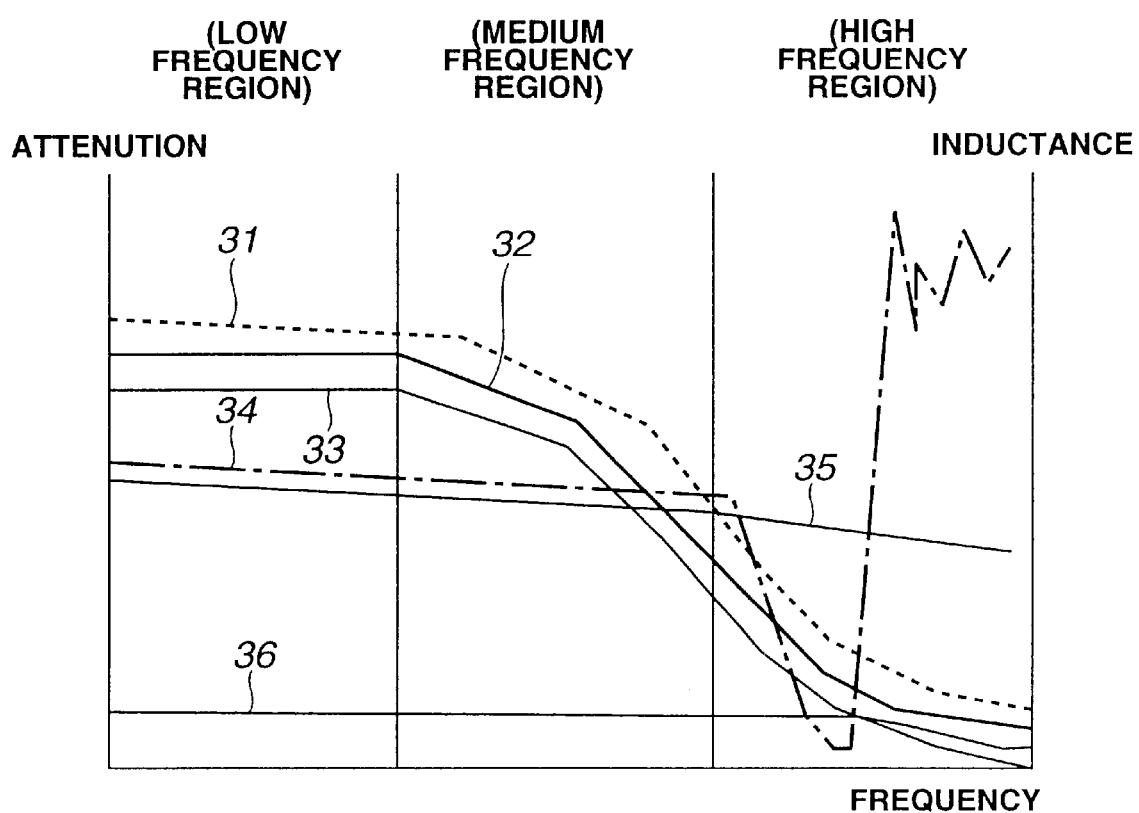
FIG. 2 is a graph showing attenuation and inductance of the wideband noise filter of FIGS. 1A, 1B and 1C.
Figure 3A:
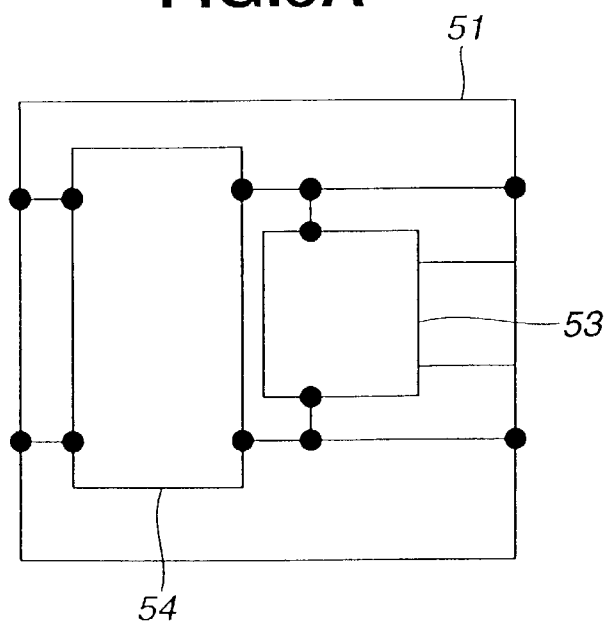
FIG. 3A is a schematic view showing a wideband connector according to a second embodiment of the present invention.
Figure 3B:
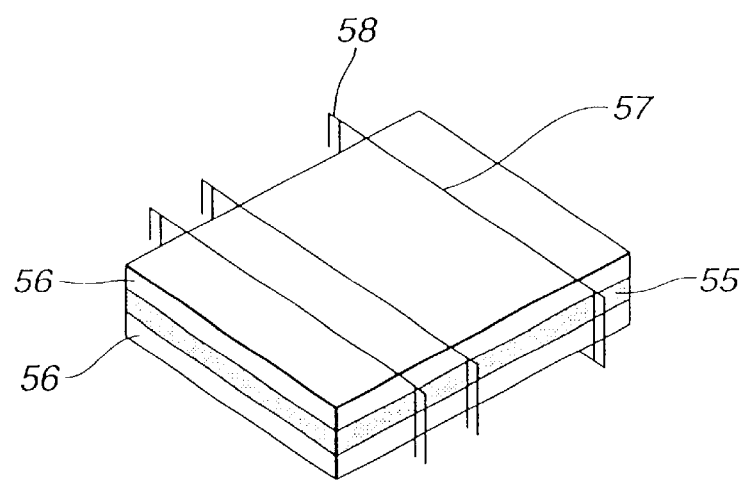
FIG. 3B is a schematic perspective view showing a multi-level structure employed in the wideband connector of FIG. 3A.
Figure 3C:
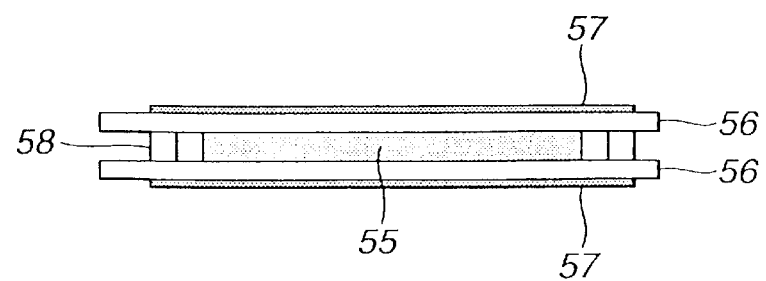
FIG. 3C is a sectional view of the multi-level structure of FIG. 3B.
Figure 3D:
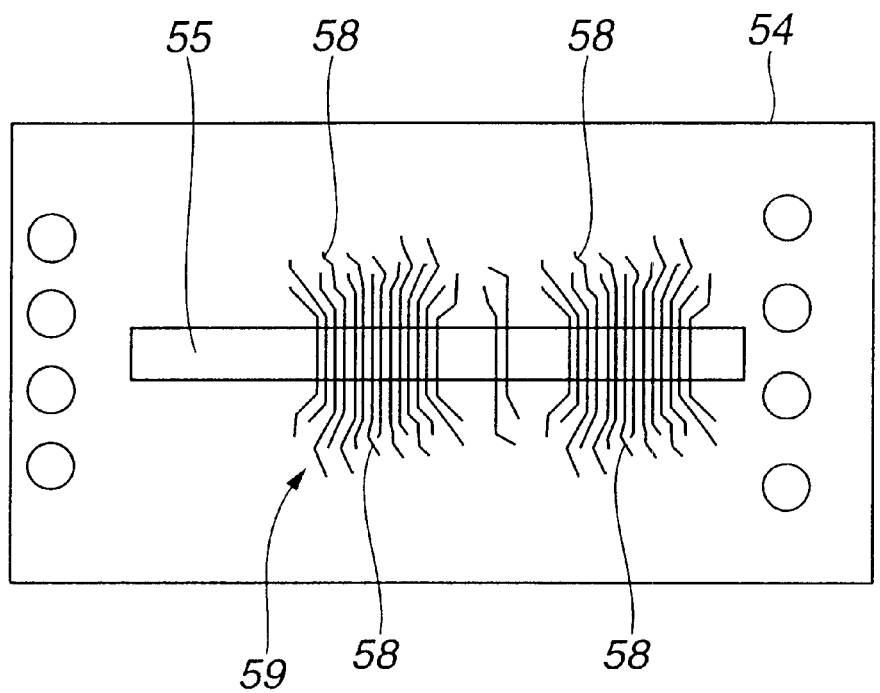
FIG. 3D is a plan view showing a wideband CM (common mode) filter 54 in the connector of FIG. 3A.
Figure 3E:
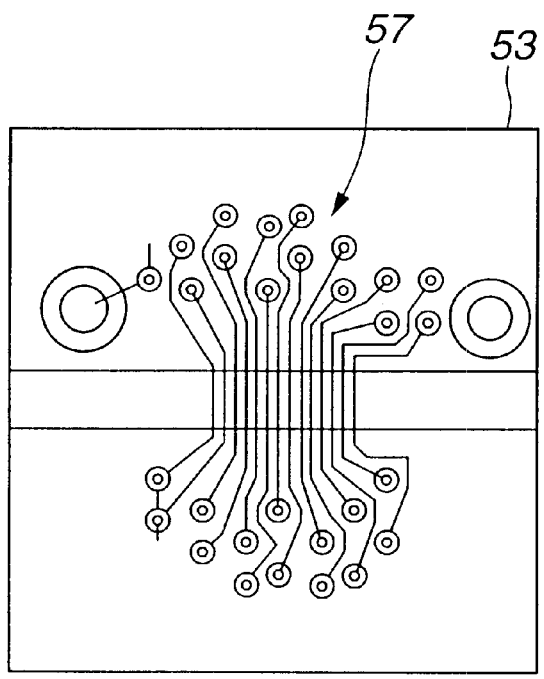
FIG. 3E is a plan view showing an impedance element 53 in the connector of FIG. 3A.

In FIG. 2, a resonance frequency (fo) required to shift a fall of the attenuation due to resonance, to the higher frequency side of the working region is given by;

$$fo = \tfrac{1}{2}\pi\sqrt{(L*C)} \tag{1}$$

In this equation, L=L1+L2, L1 is a lead wire's self-inductance, L2 is an interposed magnetic film's self-inductance, and C is a lead wire's stray capacitance.

The attenuation (or the amount of attenuation) α is;

$$\alpha = 50/(50+Z) \tag{2}$$

where $Z = R + (\omega L - 1/\omega C)$.

Therefore, it is desirable to increase L2 of the interposed magnetic film as much as possible in the low frequency region. From the medium region to the high frequency region, it is desirable to gradually decrease the total inductance inclusive of the inductance of the lead wire so as not to enter the resonance region.

In FIG. 2, a broken line 31 indicates an attenuation in the case of the device according to the first embodiment, a thick solid line 32 indicates a total inductance of the composite magnetic member according to the first embodiment, a thin solid line 33 indicates a magnetic film inductance, a one dot chain line 34 indicates an attenuation in a conventional device, a thin solid line 35 indicates an inductance of the conventional device, and a solid line 36 indicates a signal pattern inductance.

The signal pattern portion 4 on each board 3 is a twisted pair pattern portion 6 in this example. The twisted pair pattern is advantageous for reducing the cross talk between neighboring channels.

The wideband thin noise filter 1 according to this embodiment is applicable to modular jacks, interface connectors and various other connectors and devices.

The wideband thin noise filter 1 according to this embodiment is advantageous in the following points.

1. Adapted to a high speed common mode choke (the signal attenuation is small, and the noise attenuation is great).
2. Characteristic nonuniformity is small (the nonuniformity in the attenuation and resonance frequency).
3. Small in size and thin.
4. Stable in characteristic and suitable for mass production.

By contrast to the occurrence of resonance in a conventional device due to an inductance L of a lead wire and a capacitance C, the multi-level structure according to the present invention having the composite magnetic layer 2 sandwiched between the boards 3 is capable of shifting the resonance point to the higher frequency side and increasing the band. Moreover, the use of signal patterns can prevent strain from being produced in thin magnetic films, and reduce the influence of nonuniformity in a high frequency region, as compared to a conventional structure of a lead wire manually wound around a magnetic member. The employment of twisted pair patterns is advantageous in improving crosstalk between neighboring channels and EMI. The use of a high permeability amorphous as the material for the magnetic member is effective in increasing the speed and expanding the band. The wideband thin noise filter when attached to a connector is advantageous in noise removing efficiency and compactness.

As the high permeability magnetic amorphous film usable in the present invention, it is possible to employ a slit magnetic film such as a mesh, a resin mixed with magnetic material, and an assembly of magnetic wires.

FIGS. 3A~3E show a wideband, expanded function connector 51 according to a second embodiment of the present invention.

The wideband connector 51 includes a wideband CM filter 54 and a special impedance device 53, and is adapted to be operated in a constant current drive mode maintaining a constant current invariably irrespective of a load condition.

The wideband CM filter 54 and the special impedance device 53 are approximately identical in structure including FPC and magnetic films. Each of the wideband CM filter 54 and the special impedance device 53 has a magnetic member 55 having at least one magnetic thin film, and first and second (or upper and lower) boards 56 between which the magnetic member 55 is sandwiched as in the multi-layer structure shown in FIGS. 1A~1D. In this embodiment, the magnetic member 55 is a composite magnetic member including a plurality of magnetic films, and each of the boards 56 is a thin plate in the form of FPC (flexible printed circuit) like the structure of FIGS. 1A~1D. Each board 56 has a signal pattern portion 57 like the structure of FIGS. 1A~1D.

The signal pattern portions 57 of the wideband CM filter 54 are twisted pair patterns 59 adapted to a two wire pair type whereas the signal pattern portions 7 of the special impedance device 53 are not twisted pair patterns but normal signal patterns.

In this example, the special impedance device 53 has therein a terminating resistance.

In this practical example, the following conditions are all the same as the example in the first embodiment; the magnetic film thickness (=0.01 $\mu$m~500 $\mu$m), the insulator film thickness (=0.01 $\mu$m~500 $\mu$m), the pattern width (=10 $\mu$m~500 $\mu$m), the number of turns (=10~50) and the conditions for the magnetic films (material=amorphous magnetic material, aging condition, film thickness, total thickness, pattern width, inter-pattern pitch, number of turns, and insulator).

Each of the boards 56 is a thin FPC board of a laminate of insulating film, adhesive, copper foil pattern, adhesive and insulating film which are superposed successively. The first (or upper) thin board 56 has the first (or upper) signal pattern portion 57, and the second (or lower) thin board 56 has the second (or lower) signal pattern portion 57. The first and second signal patterns 57 are connected through a plurality of through holes 58 extending through the first and second boards 56.

The wideband expanded function connector 51 according to this embodiment can be build in a cable or a terminal device which may be a patch panel, an outlet, a hub, a plug or a connector unit.

Figure 5A:
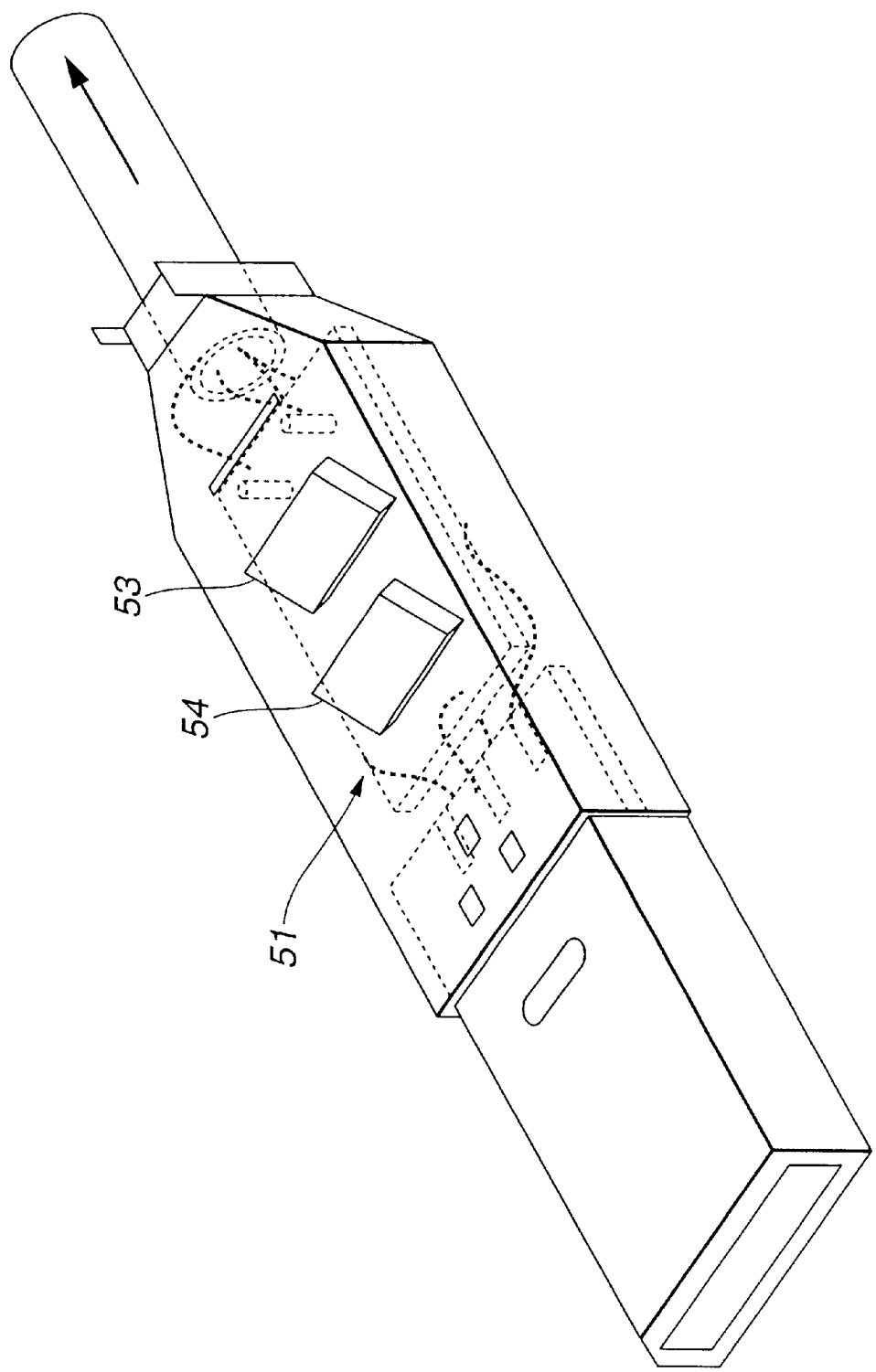
FIG. 5A is a perspective view showing a cable having the wideband connector of FIGS. 3A~3E.
Figure 7:
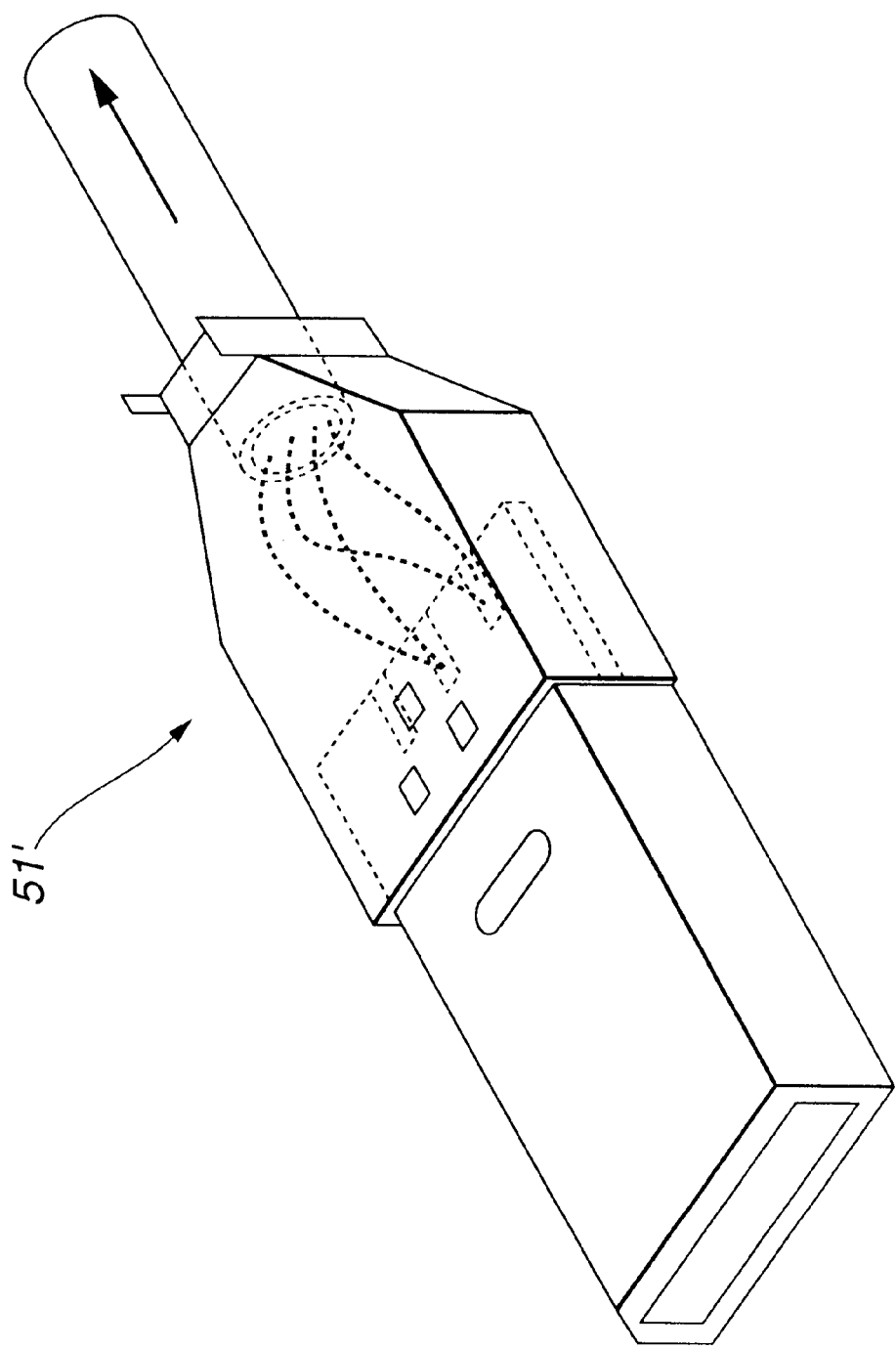
FIG. 7 is a perspective-view showing a conventional IEEE1394 cable.

FIGS. 5A and 5B show a cable having therein the wideband expanded function connector 51 according to the second embodiment. The wideband expanded function connector 51 is disposed in a high speed interface plug 60 which is connected with a high speed transmission twisted pair cable 61, as shown in FIG. 5B. The interface plug 60 is adapted to be connected to a high speed PC interface 62 as shown in FIG. 5B. In this example, the PC interface 62 is an LVDS (low voltage differential signal) interface, and a high speed constant current drive system is employed.

The wideband, expanded function connector 51 according to this embodiment can increase the signal output voltage by interaction with the constant current drive. Although the noise is also increased on the line, the wideband CM filter 54 removes only the noise, and thereby makes it possible to increase the transmission distance largely as compared with a conventional device.

In the existing LVDS transmission, the current level is considerably lowered (to 3.5 mA standard value) as compared with the conventional transmission current, so that the radiant noise is small and hence not problematical in many cases. This merit is significant since, with sufficient measures against input noises, it is possible to reduce the outside diameter of the cable.

The flow is as follows:

(1) In low current transmission at a high speed, the cable attenuation exerts great influence on the transmission distance.
(2) Since the high region attenuation of a cable is the influence of skin effect, it is not possible to reduce the attenuation without increasing the conductor diameter.
(3) The increase of the conductor diameter requires an increase of an insulator thickness in order to achieve a characteristic impedance of a cable comparable to a conventional product, resulting in an increase in the outside diameter of the cable.
(4) The high speed PC interface is in transition to LVDS. Therefore, the influence of the radiant noise is small.
(5) If the input noise can be removed by the wideband filter;
(6) Then, there is no need for shield cable.
(7) The decrease in impedance due to the shield is small.

By this sequence from (1) to (7), the combination of the wideband CM filter 54, the special impedance device 53 and a small-diameter, high-speed non-shield cable can achieve high speed, long distance transmission.

FIG. 6 shows the results of comparative performance test between the wideband expanded function connector 51 and conventional devices.

In this example, the possible transmission distance (200 Mbps) is compared by using IEEE1394 (LVDS transmission) cable. As evident from FIG. 6, the distance is about 15 m at maximum in the case of a conventional device 1 and a conventional device 2 while the maximum distance is about 60 m for the device according to this embodiment. This embodiment of the present invention can increase the transmission distance significantly. The details of this example is as follows:

1. PC interface evaluated: IEEE1394 (LVDS)
2. Cables used in this comparison:
   (i) Conventional device 1 (IEEE1394 six-core with power line)
   Conventional device 2 (IEEE1394 four-core)
   (ii) Device according to the embodiment (A wideband, expanded function connector 51 according to this embodiment plus a high speed non-shield cable)
   High speed non-shield cable: 0.5 Φ conductor, twisted pair cable

| | |
|---|---|
| 3. Transmission speed | 200 Mbps |
| 4. Transmission pattern | $2^{23}-1$ |
| 5. Code | CMI (Code Mark Inversion) |

The wideband expanded function connector 51 according to this embodiment can increase the transmission distance as explained above. Moreover, this wideband expanded function connector 51 can expand the transmission frequency band as well.

The application of the wideband expanded function connector according this embodiment is not limited to the illustrated example. This embodiment has a wide range of application. A variety of variations and modifications are possible Thus, the second embodiment of the present invention can reduce the outside diameter of the cable in combination with the wideband CM filter 54. This embodiment can reduce the cost by enabling high speed, long distance transmission with a non-shield cable. The combination of the special impedance element 53 and the wideband CM filter 54 allows an increase in the transmission distance for LVDS interface. With no need for optical fibers or shield cable, working operations on terminals are easy. Moreover, the power consumption is low because there is no need for O/E and E/O converters as in optical transmission.

In the multi-level structure according to the illustrated embodiments of the present invention, the signal patterns are arranged in the form of a broad band coil having an inductance component, wound around the magnetic member.

Figure 4A:
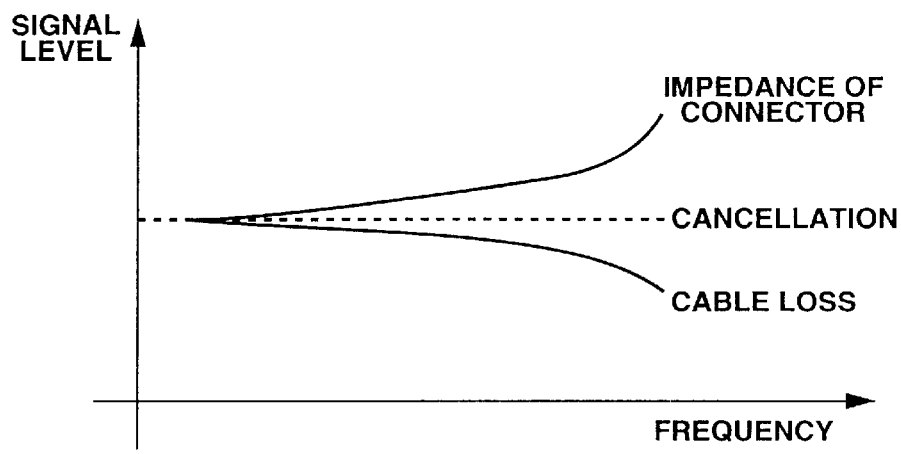
FIG. 4A is a graph for illustrating operations of the wideband connector according to the second embodiment.
Figure 4B:
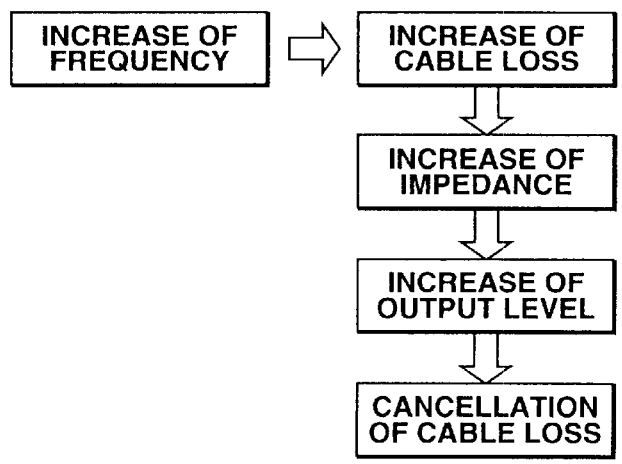
FIG. 4B is a diagram for illustrating the operations of the wideband connector according to the second embodiment.
Figure 4C:
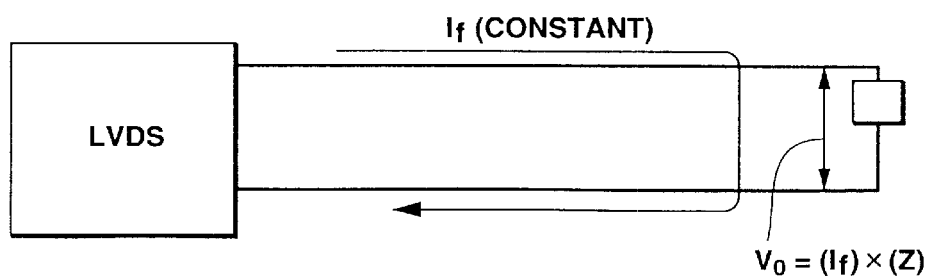
FIG. 4C is a schematic diagram for illustrating the operations of the wideband connector according to the second embodiment.

As illustrated in FIGS. 4A, 4B and 4C, the wideband expanded function connector 51 according to the second embodiment can cancel a cable loss by employing the combination of the wideband CM filter 52 and the special impedance device 53 whose impedance increases as the frequency increases, and the high speed low current transmission mode (such as LVDS).

As the frequency becomes higher, the loss in the electric cable increases under the influence of skin effect. The impedance of the special impedance device also increases. Moreover, the output level in the output of the driver circuit increases because of its constant current driving mode. As a result, the cable loss is canceled out. In FIG. 4C, the current If is held constant, and the output voltage Vo becomes higher as the impedance increases.

Thus, in the wideband, expanded function connector 51, the wideband CM filter 54 is used for removing noises from the inside and outside. On the other hand, the special impedance device 53 enables long distance, broad band transmission by increasing the impedance with increase in the frequency to cause the output level to increase with the aid of the constant current drive system, and thereby canceling the attenuation in the high frequency region inherent in a cable. In the frequency range of 1 KHz~10 GHz, for example, the impedance varies in the range of 1Ω~100 KΩ.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. A wideband noise reducing device comprising:
   a magnetic member comprising at least one magnetic film; and
   first and second boards disposed on both sides of the magnetic member so that the magnetic member is sandwiched between the first and second boards, each of the first and second boards comprising a signal pattern portion, the signal pattern portions of the first and second boards being connected with each other to form a signal line wound around the magnetic member.

2. The wideband noise reducing device according to claim 1, wherein the wideband noise reducing device is a wideband thin noise filter.

3. The wideband noise reducing device according to claim 2, wherein the wideband thin noise filter is adapted to be fixed to a connector.

4. The wideband noise reducing device according to claim 1, wherein the magnetic member is a composite magnetic member comprising a plurality of magnetic films.

5. The wideband noise reducing device according to claim 4, wherein each of the first and second boards comprises an FPC board.

6. The wideband noise reducing device according to claim 4, wherein the thickness of each magnetic film is in the range from 0.01 μm to 500 μm, and the signal pattern portion of each board has a pattern width in the range from 10 μm to 500 μm.

7. The wideband noise reducing device according to claim 6, wherein the magnetic films are made of an alloy comprising 1~30% Fe, and 30~82% Ni.

8. The wideband noise reducing device according to claim 7, wherein the alloy further comprises 0~20% Cu and 0~10% Mo.

9. The wideband noise reducing device according to claim 6, wherein the magnetic films are made of an alloy comprising 60~80% Co, 1~20% Nb, and 1~20% Zr.

10. The wideband noise reducing device according to claim 4, wherein the magnetic films are different from one another in at least one of film thickness and heat treatment condition, and have different characteristics of a magnetic permeability with respect to frequency.

11. The wideband noise reducing device according to claim 10, wherein the magnetic thin film is a slit magnetic film.

12. The wideband noise reducing device according to claim 4, wherein the magnetic films are uniform in film thickness and heat treatment condition and have an equal characteristic of a magnetic permeability with respect to frequency.

13. The wideband noise reducing device according to claim 1, wherein the magnetic thin film is made of amorphous material.

14. The wideband noise reducing device according to claim 1, wherein the signal pattern portion of at least one of the first and second boards has a twisted pair pattern.

15. The wideband noise reducing device as claimed in claim 1, wherein the wide band noise reducing device comprises a connector which comprises:

a wideband noise filter comprising the magnetic member, and the first and second boards each having the signal patter portion; and a second element comprising a magnetic member comprising at least one magnetic film, and first and second boards disposed on both sides of the magnetic member of the second element so that the magnetic member of the second element is sandwiched between the first and second boards of the second element, each of the first and second substrate plates comprising a signal pattern portion, the signal pattern portions of the first and second boards in the second element being connected with each other to form a signal line wound around the magnetic member of the second element.

16. The wideband noise reducing device according to claim 15 wherein the wideband noise reducing device is a wideband connector which comprises the wideband noise filter which is a wideband CM filter and the second element which is an impedance element.

17. The wideband noise reducing device as claimed in claim 16 wherein the wideband connector is adapted to be operated in a constant current drive mode in which a current is held constant irrespective of a load condition.

18. The wideband noise reducing device as claimed in claim 15, wherein each of the signal pattern portions of the wideband noise filter has a twisted pair pattern, and each of the signal pattern portions of the impedance element has a parallel pattern.

19. The wideband noise reducing device as claim in claim 15, wherein the noise reducing device further comprises a cable connected with the connector.

* * * * *